(12) United States Patent
Frantzeskakis et al.

(10) Patent No.: US 8,508,266 B2
(45) Date of Patent: Aug. 13, 2013

(54) DIGITAL PHASE LOCKED LOOP CIRCUITS WITH MULTIPLE DIGITAL FEEDBACK LOOPS

(75) Inventors: Emmanouil Frantzeskakis, Ilioupolis (GR); Georgios Sfikas, Glyfada (GR); Stephen Wu, Fountain Valley, CA (US); Radha Srinivasan, Irvine, CA (US); Henrik Tholstrup Jensen, Long Beach, CA (US); Brima Ibrahim, Laguna Hills, CA (US)

(73) Assignee: Broadcom Corporation, Irvine, CA (US)

( * ) Notice: Subject to any disclaimer, the term of this patent is extended or adjusted under 35 U.S.C. 154(b) by 179 days.

(21) Appl. No.: 13/173,694

(22) Filed: Jun. 30, 2011

(65) Prior Publication Data

US 2013/0002317 A1  Jan. 3, 2013

(51) Int. Cl.
*H03L 7/06* (2006.01)
(52) U.S. Cl.
USPC ........................................... 327/156; 327/147
(58) Field of Classification Search
USPC .................................................. 327/147, 156
See application file for complete search history.

(56) References Cited

U.S. PATENT DOCUMENTS

| | | | |
|---|---|---|---|
| 2012/0100821 A1* | 4/2012 | Dan et al. | 455/269 |
| 2012/0133401 A1* | 5/2012 | Tsuda | 327/147 |
| 2012/0161834 A1* | 6/2012 | Lee et al. | 327/156 |
| 2012/0176169 A1* | 7/2012 | Sinha et al. | 327/156 |
| 2012/0249195 A1* | 10/2012 | Guo et al. | 327/156 |
| 2012/0319749 A1* | 12/2012 | Thaller et al. | 327/158 |
| 2013/0002317 A1* | 1/2013 | Frantzeskakis et al. | 327/156 |
| 2013/0027102 A1* | 1/2013 | Chen et al. | 327/158 |

\* cited by examiner

*Primary Examiner* — Adam Houston
(74) *Attorney, Agent, or Firm* — Farjami & Farjami LLP

(57) ABSTRACT

Designs of devices having digital phase locked loop (DPLL) circuits that include multiple digital feedback loops to generate high frequency clock signals by a digitally controlled oscillator (DCO). A time-to-digital converter (TDC) module is provided in such a DPLL circuit to receive an input reference clock signal and a first feedback clock signal from a first digital feedback loop and produces a digital TDC output indicative of a first phase error caused by a difference in time between the input reference clock signal and the first feedback clock signal. A second digital feedback loop is provided to generate a second digital feedback signal indicative of a second phase error caused by a difference in frequency between a desired clock signal and a generated clock signal generated by the DCO. The first and second digital feedback loops are coupled to the DCO to generate the high frequency clock signals.

10 Claims, 8 Drawing Sheets

DIGITAL PHASE LOCKED LOOP CIRCUITS WITH MULTIPLE DIGITAL FEEDBACK LOOPS

BACKGROUND

This patent document relates to techniques, devices, and systems for digital phase locked loops in digital circuits and electronics, digital signal processing and communications.

A digital phase locked loop (DPLL) can be formed by a digitally controlled oscillator (DCO) that generates a high frequency clock signal based on a digital input control word. A digital feedback loop can use the DCO-produced high frequency clock signal to generate a feedback signal and a time-to-digital converter (TDC) as a digital phase detector to determine a phase difference between the DCO-produced high frequency clock signal and a low frequency reference clock signal. This phase difference is sent into subsequent digital processing stage of the DPLL which includes a digital loop filter that generates the digital input control word to the DCO for generating the high frequency clock signal.

BRIEF DESCRIPTION OF THE DRAWINGS

Like reference symbols and designations in the various drawings indicate like elements.

DETAILED DESCRIPTION

Figure 1:
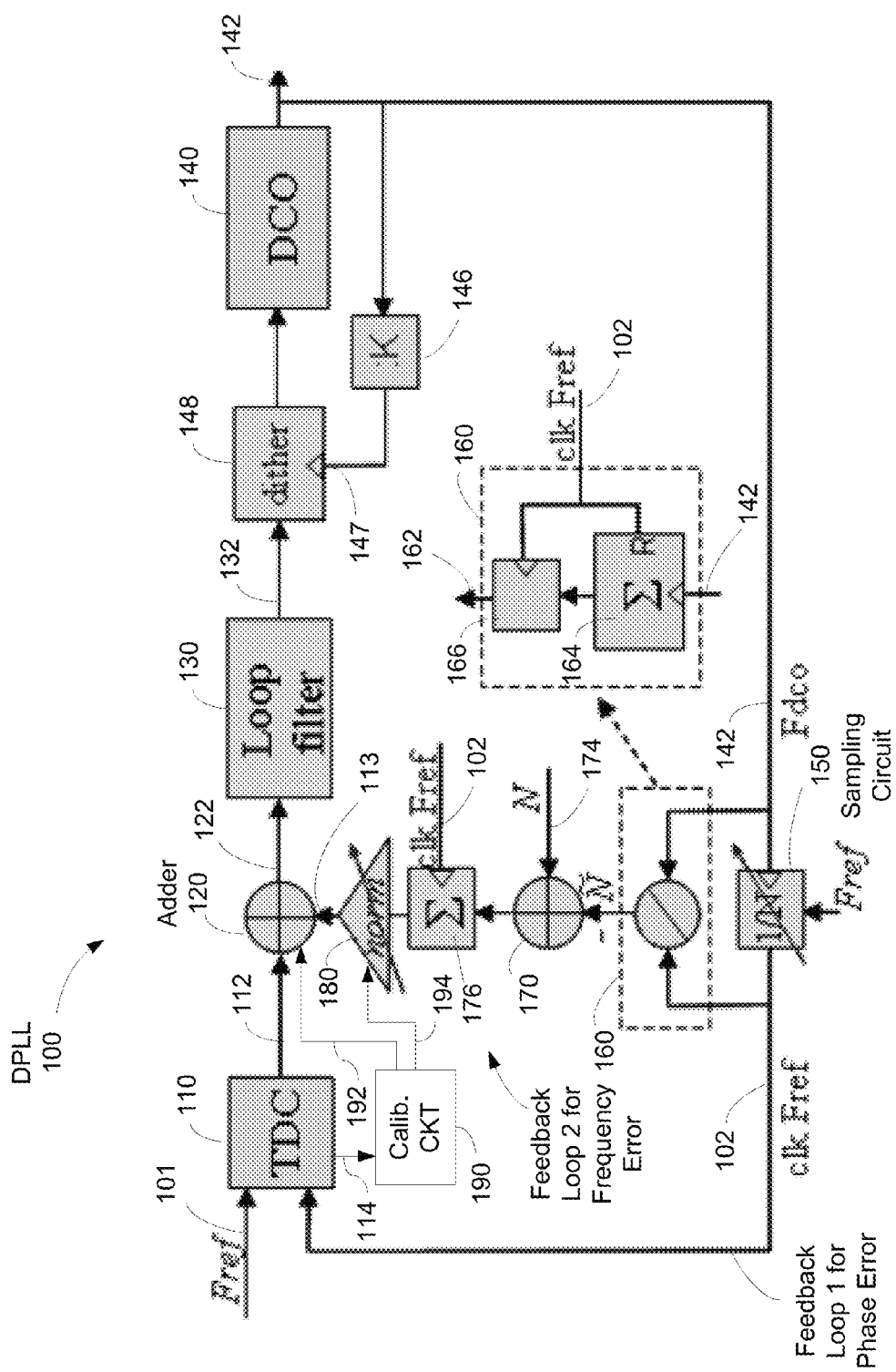
FIG. 1 shows an example of a digital phase locked loop (DPLL) circuit with two digital feedback loops.

Digital phase locked loop (DPLL) circuits as described in this document are digital circuits that include multiple digital feedback loops to generate high frequency clock signals. Such DPLL circuits can be implemented in configurations that lock the generated high frequency clock signal in phase with an input reference clock signal and lock the frequency of the generated high frequency clock signal to a desired clock frequency which is higher than the frequency of the input reference clock frequency. Examples provided herein use two digital feedback loops and the described circuit designs and techniques can be used to construct DPLL circuits that have more than two digital feedback loops.

In the DPLL circuit examples described herein, a time-to-digital converter (TDC) is provided in the described DPLL circuits to digitally measure the time difference between the generated high frequency clock signal and the input reference clock signal. In this context, the TDC is used to replace the conventional phase/frequency detector commonly used in other PLL circuits and thus the performance of the TDC can directly affect the performance of the DPLL circuits. Various DPLL designs with multiple feedback loops are provided to improve the DPLL performance. Based on such DPLL designs, techniques for calibrating TDC parameters are disclosed to improve the accuracy of the TDC measurements and to reduce the noise in the DPLL circuits. In addition, circuit designs and techniques are provided to use the digital feedback loops in the described DPLL circuit to mitigate meta-stability in the DPLL circuits and to reduce the noise in the frequency of the generated high frequency clock signal.

DPLL circuits as described in this document are digital circuits that can be implemented in certain ways that achieve one or more advantages over various analog PLL circuits and other digital PLL circuits, such as improved immunity to noise, compact size based on digital CMOS process, low power operation, and ease of integration with digital baseband circuits and other digital circuits in system-on-chip devices for mobile computing devices and mobile communications. DPLL circuits as described in this document can be used for clock generation and other uses in a wide range of digital circuits and electronics devices, including radio receivers and transmitters in various communication devices including mobile phones and computers, Bluetooth devices, WiFi devices, near field communication (NFC) devices, radio receivers based on various radio standards (such as the FM radio standard, HD-Radio standard, National Radio Systems Committee NRSC-5B In-band/on-channel Digital Radio Broadcasting Standard, and Digital Audio Broadcasting Standard), DVB-H (Digital Video Broadcasting-Handheld) and DVBT (Digital Video Broadcasting-Terrestrial) devices and others.

Various implementations of DPLL circuits and devices with such DPLL circuits are possible based on what is described and illustrated.

In one implementation, for example, a digital phase locked loop circuit can include a time-to-digital converter (TDC) module that receives an input reference clock signal and a first feedback clock signal and produces a digital TDC output indicative of a first phase error caused by a difference in time between the input reference clock signal and the first feedback clock signal; an adder that adds the digital TDC output indicative of the first phase error and a second digital feedback signal indicative of a second phase error caused by a difference in frequency between a desired clock signal and a generated clock signal generated by the digital phase locked loop circuit to produce a digital adder output; a digitally controlled oscillator (DCO) that produces a DCO output clock signal as the generated clock signal, and the first and second digital feedback loops that are coupled to the adder and are configured to render the generated clock signal in the DCO output clock signal to be close to the desired clock signal and to be phase locked to the input reference clock sign.

In another implementation, a digital phase locked loop circuit can include a time-to-digital converter (TDC) module that receives an input reference clock signal and a first feedback clock signal and produces a digital TDC output indicative of a first phase error caused by a difference in time between the input reference clock signal and the first feedback clock signal; an adder that adds the digital TDC output indicative of the first phase error and a second digital feedback signal indicative of a second phase error caused by a difference in frequency between a desired clock signal and a generated clock signal generated by the digital phase locked loop circuit to produce a digital adder output; a digital loop filter that receives the digital adder output to produce a filtered digital adder output; a digitally controlled oscillator (DCO) that receives the filtered digital adder output and produces a DCO output clock signal based on the received filtered digital adder output as the generated clock signal; a first digital feedback loop that is coupled to the DCO and the TDC module and produces the first digital feedback clock signal to the TDC module based on the DCO output clock signal; a second digital feedback loop that is coupled to the adder and the DCO to produce the second digital feedback signal to the adder based on the DCO output clock signal; and a calibration circuit coupled to the TDC module to perform a calibration on the TDC module and coupled to at least one of the first and second digital feedback loops to cause a modification in at least one of the first and second digital feedback signals based on the performed calibration.

In another implementation, a digital phase locked loop circuit can include a time-to-digital converter (TDC) module that receives an input reference clock signal and a first feedback clock signal and produces a digital TDC output indicative of a first phase error caused by a difference in time between the input reference clock signal and the first feedback clock signal; an adder that adds the digital TDC output indicative of the first phase error and a second digital feedback signal indicative of a second phase error caused by a difference in frequency between a desired clock signal and a generated clock signal generated by the digital phase locked loop circuit to produce a digital adder output; a digital loop filter that receives the digital adder output to produce a filtered digital adder output; a digitally controlled oscillator (DCO) that receives the filtered digital adder output and produces a DCO output clock signal based on the received filtered digital adder output as the generated clock signal; a first digital feedback loop that is coupled to the DCO and the TDC module and produces the first digital feedback clock signal to the TDC module based on the DCO output clock signal; a second digital feedback loop that is coupled to the adder and the DCO to produce the second digital feedback signal to the adder based on the DCO output clock signal; and a sampling circuit that is coupled to and shared by both the first and second digital feedback loops to receive the DCO output clock signal and the input reference clock signal, the sampling circuit operable to sample the input reference clock signal at a clock rate of the DCO output clock signal to produce the first digital feedback signal.

In yet another implementation, a digital phase locked loop circuit can include a time-to-digital converter (TDC) module that receives an input reference clock signal and a first feedback clock signal and produces a digital TDC output indicative of a first phase error caused by a difference in time between the input reference clock signal and the first feedback clock signal; an adder that adds the digital TDC output indicative of the first phase error and a second digital feedback signal indicative of a second phase error caused by a difference in frequency between a desired clock signal and a generated clock signal generated by the digital phase locked loop circuit to produce a digital adder output; a digital loop filter that receives the digital adder output to produce a filtered digital adder output; a digitally controlled oscillator (DCO) that receives the filtered digital adder output and produces a DCO output clock signal based on the received filtered digital adder output as the generated clock signal; a first digital feedback loop that is coupled to the DCO and the TDC module and produces the first digital feedback clock signal to the TDC module based on the DCO output clock signal; and a second digital feedback loop that is coupled to the adder and the DCO to produce the second digital feedback signal to the adder based on the DCO output clock signal. The second digital feedback loop includes: a digital counter that receives the first feedback clock signal and the DCO output clock signal and counts an integer number of clock periods in the DCO output clock signal within one clock period of the first feedback clock signal; a comparison circuit that receives the integer number from the digital counter and a ratio of the clock rate of the desired clock signal over the clock rate of the input reference clock signal and produces a difference between the integer number from the digital counter and the ratio; and an integrator that integrates the difference between the integer number from the digital counter and the ratio to produce the second phase error in the second digital feedback signal.

FIGS. 1-7 show various examples of DPLL circuit designs to illustrate the above and other implementations, associated circuit operations and technical features.

FIG. 1 shows an example of a digital phase locked loop (DPLL) circuit 100 based on one implementation of the techniques described herein. The digital phase locked loop circuit 100 is a digital circuit that receives a slow or low frequency input reference clock signal 101 at a clock rate or frequency of $F_{ref}$ and uses a digitally controlled oscillator (DCO) 140 to generate a fast or high frequency clock signal 142 at a clock rate or frequency of $F_{dco}$ (>$F_{ref}$) that is locked to the input reference clock signal 101 in phase. In operation, the digital phase locked loop circuit 100 is operated to generate the fast clock signal 142 as close as possible to a desired fast clock that is represented by a control parameter N in the unit of the clock rate or frequency $F_{ref}$ of the input reference clock signal 101: N=$F_{desired}/F_{ref}$. The control parameter N can be a non-integer number. The desired fast clock signal ($F_{desired}$) is not an actual clock signal in the DPLL circuit 100 and the integer N is a DPLL control parameter and is used as a control input to the DPLL 100 to set and to control the DCO generated clock signal 142 ($F_{dco}$). A large value for N is sent into the DPLL 100 to generate a high frequency $F_{dco}$ of the DCO generated clock signal 142 and a small value for N is sent into the DPLL 100 to generate a low frequency $F_{dco}$ of the DCO generated clock signal 142.

In the specific example in FIG. 1, the digital phase locked loop circuit 100 provides two digital feedback loops based on the fast clock signal 142 output from the DCO 140 to ensure (1) phase locking between the generated fast clock signal 142 and the input reference clock signal 101 and (2) the frequency error, i.e., the difference between the desired clock rate $F_{desired}$ and the generated clock rate $F_{dco}$, is significantly small or minimized. As will be described below, this frequency error in the DPLL 100 is represented by the difference between the control parameter N and an integer output Ñ that is produced by an adder or comparison circuit in one of the digital feedback loops responsible for detecting the frequency error.

The digital phase locked loop circuit 100 includes a time-to-digital converter (TDC) or time delay control module 110 as part of the first feedback loop that is coupled to the output of DCO 140. This first feedback loop produces a first feedback clock signal 102 (clk $F_{ref}$) of a clock rate or frequency slower than the clock rate or frequency of $F_{dco}$ of the DCO output clock signal 142. The TDC module 110 receives the input reference clock signal 101 ($F_{ref}$) and the first feedback clock signal 102 (clk $F_{ref}$) and produces a digital TDC output 112 indicative of a phase error caused by a difference in time between the input reference clock signal 101 and the feedback clock signal 102.

The digital phase locked loop circuit 100 includes a second digital feedback loop that is coupled to the output of the DCO 140 to receive the generated clock signal 142 ($F_{dco}$) and information of the desired clock signal ($F_{desired}$). This second digital feedback loop produces a second digital feedback signal 113 indicating a phase difference caused by a difference in frequency between the desired clock signal ($F_{desired}$) and the generated clock signal 142 ($F_{dco}$).

An adder 120 is provided and is operated to add the digital TDC output 112 from the first digital feedback loop and the second digital feedback signal 113 from the second digital feedback loop to produce a digital adder output 122 that represents the total phase error collectively caused by the difference in time between the input reference clock signal 101 and the feedback clock signal 102 and the difference in frequency between the desired clock signal ($F_{desired}$) and the generated clock signal 142 ($F_{dco}$). The digital phase locked loop circuit 100 operates the two feedback loops to minimize this total phase error to achieve the desired phase locking between the generated fast clock signal 142 and the input reference clock signal 101 and to make the generated clock rate $F_{dco}$ close to the desired clock rate $F_{desired}$.

Downstream from the adder 120, a digital loop filter 130 is coupled to the output of the adder 120 to receive the digital adder output 122 and to produce a filtered digital adder output 132 that is fed into the digitally controlled oscillator (DCO) 140. The DCO 140 processes the received filtered digital adder output 132 and produces the DCO output clock signal 142. The DCO 140 can be implemented in various configurations, such as a voltage controlled oscillator (VCO) that is controlled by a capacitor bank and can be tuned to operate at various DCO clock rates or frequencies in the DCO output 142. The DCO 140 is configured to receive and to operate on an integer digital input from the loop filter 130 to generate the correct DCO output 142.

In the example in FIG. 1, the DCO 140 is configured to operate properly on integer inputs. However, the output of the loop filter 130 may not be always integers and may have non-integer numbers such as fractional numbers. Hence, a dithering mechanism is provided to overcome this technical issue. In the example in FIG. 1, a dither circuit 148 is coupled between the loop filter 130 and the DCO 140 to dither the filtered output 132 at a clock rate higher than the clock in the filtered output 132 to average multiple samples within one clock cycle of the filter output 132 to produce an integer output and to improve the frequency resolution the DCO. A frequency divider 146 is provided to receive the DCO output 142 and to produce a clock signal 147 that is K times lower than the clock of the DCO output 142 but is higher than the clock rate of the filtered output 132. In some implementations, the dither circuit 148 may split the loop filter output 132 into (1) an integer part and (2) a fractional part (non-integer part) and processes the fractional part over multiple clock cycles of the loop filter output 132 during one clock cycle of the clock signal 147 to "average" the fractional part over these clock cycles to produce a sequence of integer numbers with the same average value.

Figure 2:
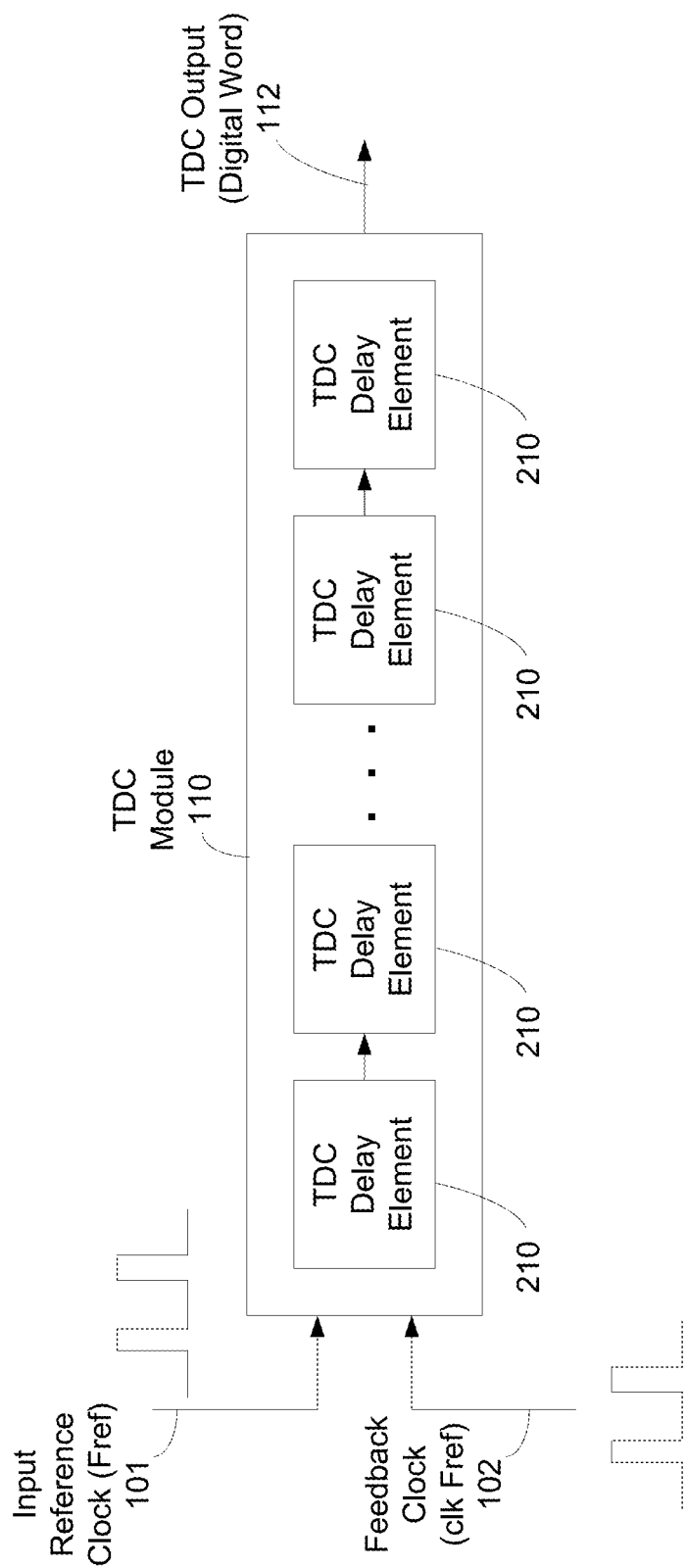
FIG. 2 shows an example of a time-to-digital converter (TDC) or a time delay control module used in FIG. 1.

FIG. 2 shows an exemplary implementation of the TDC module 110. In this example, the TDC module 110 is implemented by a series of TDC delay elements 210 that produce their respective time delays for measuring the difference in time between the input reference clock signal 101 and the feedback clock signal 102. Different TDC delay elements 210 can be designed as identical elements with the same delay in each TDC delay element (i.e., TDC resolution). Assuming all TDC delay elements 210 to be identical in their designs, operations and performance, the output 112 of the TDC module 110 can be expressed in a digital word representing the number (m) of TDC delay elements that produce the difference in time between the input reference clock signal 101 and the feedback clock signal 102. For example, the assuming all TDC delay elements have an identical delay of 10 ps, a time difference of 400 ps between rising edges of the input reference clock signal 101 and the feedback clock signal 102 can then be represented by 40 TDC delay elements and thus the output TDC module is 40 plus the TDC offset in time. However, physical properties of such identically designed TDC delay elements 210 can differ and thus this difference can cause variations in the delay from one TDC delay element 210 to another. Other factors and properties of the TDC delay elements 210 and the overall circuit of the TDC module 110 can also cause variations, such as a variation in the delay in each TDC delay element 210 due to a change in temperature. As such, the actual output of the TDC module 110, the number (m) of the TDC delay elements 210 that is intended to represent the corresponding difference in time between the two input clock signals 101 and 102, is not an accurate representation of this difference in time and needs calibration so that the calibrated TDC output more accurately represents the actual difference in time between the two input clock signals 101 and 102. The calibrated TDC output is then used by the DPLL circuit 100 to generate the DCO output 142.

In the specific TDC calibration described in this example, the calibrated TDC output can be represented by the actual TDC output (m) of the TDC delay elements 210, a TDC gain factor A and a TDC offset in a unit of the normalized delay per one TDC delay element:

$$\text{Calibrated TDC output} = A(\text{TDC output } m + \text{TDC offset})$$

The TDC gain parameter A and the TDC offset parameter are two unknown TDC parameters. To determine these two TDC parameters, a calibration circuit is provided to perform calibration measurements in operating the DPLL circuit 100 and to use the calibration measurements and the TDC measurement (m) to determine the two TDC parameters (TDC gain and TDC offset). Therefore, the determined TDC gain and offset are then used to calibrate the TDC output in operating the DPLL circuit 100. The calibrated TDC output is used by the adder 120 to produce the adder output 122 that carries the total phase error from both the frequency error of the DCO clock frequency Fdco from the desired clock and the phase error caused by the difference in time between the two clock signals 101 and 102 received by the TDC module 110

Referring back to FIG. 1, one exemplary implementation of a calibration circuit 190 is shown to receive a TDC signal 114 from the TDC module 110 for the calibration operation for determining the TDC gain and offset. The TDC signal 114 can include the TDC measurement (m) and values of the calibration measurements. The calibration circuit 190 processes the information in the TDC signal 114 to determine the TDC gain and offset values and produce one or more output signals to output the determined TDC gain and offset values for calibrating the operations in connection with the TDC output 112. This calibration circuit 190 is coupled to cause a correction in the digital adder output 122 that accounts for the TDC offset and variations in the TDC delay elements. Based on this TDC calibration, the first and second digital feedback loops are configured to render the generated clock signal 142 in the DCO output clock signal to be close to the desired clock signal $F_{desired}$ represented by the control signal 174 carrying the integer control parameter N and to be phase locked to the input reference clock signal 101.

Various circuit designs may be implemented in the DPLL circuit 100 to calibrate certain operations in connection with the TDC output 112. In the example in FIG. 1, the calibration circuit 190 is shown to produce a first output signal 192 representing the determined TDC offset parameter and a second output signal 194 representing the determined TDC gain parameter. The first output signal 192 is fed into the adder 120 which includes the determined TDC offset parameter in producing the adder output signal 122 based on processing of the received signals 112 and 113. The second output signal 194 is fed into the second digital feedback loop that produces the second digital feedback signal 113 to the adder 120.

The second digital feedback loop includes a digital sampling circuit 150, a digital counter 160, a digital comparison circuit 170, a digital integrator 176 and a normalization circuit 180. In the exemplary implementation in FIG. 1, the first digital feedback loop and second digital feedback loop share the digital sampling circuit 150 as a common circuit element which is coupled to both the first and second digital feedback loops.

The digital sampling circuit 150 is designed to receive the input reference clock signal 101 as input data signal and receive the DCO output clock signal 142 as a clock signal ($F_{dco}$). It operates to sample the input reference clock signal 101 at the clock rate ($F_{dco}$) of the DCO output clock signal 142 to generate sampled data output as the feedback clock signal 102 (clk $F_{ref}$) which has a slower clock rate that is slower than the clock rate $F_{dco}$ of the DCO output clock signal 142 and is generally comparable to the input reference clock $F_{ref}$.

The digital counter 160 is connected to the output of the digital sampling circuit 150 to receive the slow feedback clock signal 102 (clk $F_{ref}$) output by the digital sampling circuit 150 and the DCO 140 to receive the fast DCO output clock signal 142. The digital counter 160 counts the number of clock cycles or periods, Ñ, of the fast DCO output clock signal 142 within one clock cycle or period of the slow feedback clock signal 102 (clk $F_{ref}$). In this context, the digital sample device 150 effectuates a frequency divider that divides the fast clock rate $F_{dco}$ of the DCO output clock signal 142 by Ñ to produce the slow feedback clock signal 102 (clk $F_{ref}$) where the clock rate clk $F_{ref}$ is equal to ($F_{dco}$/Ñ). In the example in FIG. 1, in addition to being a clock signal for operating the digital counter 160, the slow feedback clock signal 102 (clk $F_{ref}$) is used as the clock signal for operating various circuit elements in the DPLL 100, e.g., the integrator 176 and the loop filter 130.

The digital counter 160 can be implemented in various configurations. The insert in FIG. 1 shows one example based on a digital accumulator 164 and a register 166. The accumulator 164 in this example is shown to receive the DCO output clock signal 142 from the DCO 140 as a clock signal and to receive the slow feedback clock signal 102 (clk $F_{ref}$) as the data input. The accumulator 164 accumulates the clock cycles (rising edges) of the DCO output clock signal 142 while the register 166 is operated under the clock clk $F_{ref}$ to receive and store the accumulated content in the accumulator 164. Whenever the accumulator 164 receives a rising edge of the slow feedback clock signal 102, the accumulator 164 resets and restarts new accumulation. In other implementations, the digital counter 160 may also be implemented as a free running counter without the above resetting step in the example shown in the insert of FIG. 1.

The digital comparison circuit 170 is fed with an input signal 174 that represents the desired clock signal at the desired clock rate or frequency of $F_{desired}$. This input signal 174 is used to set the desired clock rate or frequency of $F_{desired}$ for the DCO 140 to generate. In the example in FIG. 1, the input signal 174 carries the control parameter N that is a number representing the desired clock rate or frequency of $F_{desired}$ in the unit of the input reference clock rate or frequency $F_{ref}$ of the input reference clock signal 101. The control parameter N may be an integer and may be a non-integer number. The digital comparison circuit 170 also receives the output (Ñ) from the digital counter 160 and produces a difference between N and Ñ to represent the frequency error of the circuit 100: the difference between the desired frequency of $F_{desired}$ and the actually generated frequency $F_{dco}$ of the DCO output clock signal 142. The digital comparison circuit 170 can be implemented by an adder or subtractor circuit in some implementations. Other circuit designs can also be used for the digital comparison circuit 170 to produce the difference between the two inputs.

The integrator 176 is a digital accumulator operated under the slow feedback clock signal 102 (clk $F_{ref}$) to integrate over time the output of the digital comparison circuit 170 to produce an integrated output. This integrated output of the integrator 180 converts the frequency difference between the desired frequency of $F_{desired}$ and the actually generated frequency $F_{dco}$ into a phase error that is caused by the frequency error of the circuit 100. The output of the integrator 176 is the integrated difference between N and Ñ expressed in the number of clock cycles of the fast clock $F_{dco}$ of the DCO output clock signal 142. The TDC output 112 is a phase error represented the number (m) of TDC delay elements that produce the difference in time between the input reference clock signal 101 and the feedback clock signal 102 and thus is in a different unit from the output of the integrator 176. In order to combine these two signals in the adder 120 to produce the adder output 122 representing both phase errors from the two feedback loops, a conversion circuit can be implemented in the path of the TDC output 112 to convert the TDC output 112 from the unit of the number of TDC delay elements to the unit of number of the number of clock cycles of the fast clock $F_{dco}$ of the DCO output clock signal 142. Alternatively, a conversion circuit can be implemented in the second feedback loop between the adder 112 and the integrator 176 to convert the output of the integrator 176 from the unit of number of the number of clock cycles of the fast clock $F_{dco}$ of the DCO output clock signal 142 into the unit of the number of TDC delay elements. Hence, in these two exemplary implementations of the conversion circuit, the calibration circuit 190 is configured to cause a modification by the conversion circuit in one of the of the first and second digital feedback loops to convert the phase error in the modified digital feedback signal to have a same unit as the phase error in the other digital feedback signal.

The example in FIG. 1 shows an example of the later conversion design where the normalization circuit 180 is coupled between the adder 120 and the integrator 176 to convert the output of the integrator 176 from the unit of number of the number of clock cycles of the fast clock $F_{dco}$ of the DCO output clock signal 142 into the unit of the number of TDC delay elements. The normalization circuit 180 is coupled to the calibration circuit 190 to receive the second output signal 194 representing the determined TDC gain parameter (A) which can be expressed in terms of the ratio of the time period of one clock cycle of fast clock $F_{dco}$ over the TDC resolution (i.e., delay per TDC delay element). Under this design, the normalization circuit 180 includes a multiplier that multiplies the above ratio with the output of the integrator 176 to normalize the output of the integrator 176 in the unit of the number of TDC delay elements.

Figure 3:
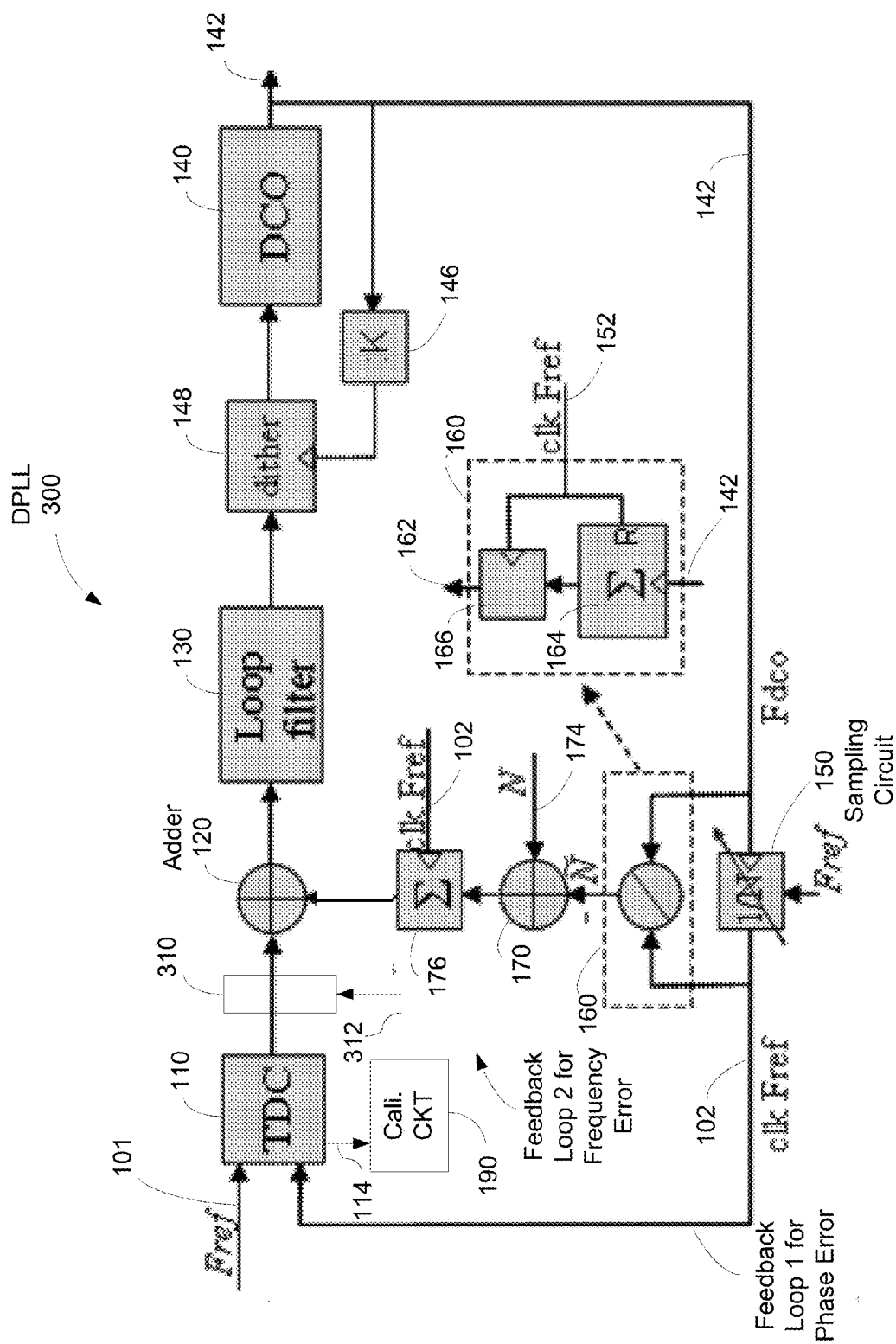
FIG. 3 shows another example of a digital phase locked loop (DPLL) circuit with two digital feedback loops.

FIG. 3 shows another option for performing the signal conversion in combining two feedback signals from the two feedback loops in the adder 120 where a conversion circuit 310 is implemented in the path of the TDC output 112 to convert the TDC output 112 from the unit of the number of TDC delay elements to the unit of number of the number of clock cycles of the fast clock $F_{dco}$ of the DCO output clock signal 142. In this example, the calibration circuit 190 is coupled to the conversion circuit 310 to send the information on the ratio of the time period of one clock cycle of fast clock $F_{dco}$ over the TDC resolution (i.e., delay per TDC delay element). The conversion circuit 310 in this example is a division circuit that divides the TDC output 112 by the ratio to convert the TDC output into a value in the unit of number of the number of clock cycles of the fast clock $F_{dco}$. In comparison with the normalization circuit 180 in FIG. 1, the conversion circuit 310 has an inverter circuit which is more complex than the multiplication circuit of the normalization circuit 180.

The above ratio from the calibration circuit 190 is dependent on parameters of the TDC module 110 and thus can vary as the TDC module 110 changes its physical properties (e.g., variation with the temperature). In FIG. 3, the division of the TDC output 112 by the ratio in the conversion circuit 310 renders the converted TDC output to the adder 120, independent of or less sensitive to, variations in the TDC module 110. Accordingly, the output 122 of the adder 120 to the input of the loop filter 130 is sensitive to variations in the TDC module 110. Because the gain of the loop filter 130 determines the bandwidth of DPLL, the bandwidth of the DPLL circuit in FIG. 3 is less sensitive to the variations in the TDC module 110. This feature can be an advantage of the design in FIG. 3. In comparison, in the design in FIG. 1 where the multiplication of the normalization circuit 180 maintain the normalization factor in the second digital feedback signal 113, the adder output 122 retains the dependency of the variations of the TDC module 110 and imputes this TDC dependence to the gain of the loop filter 130. As a result, the loop bandwidth of the DPLL in FIG. 1 exhibits an undesired dependency on TDC variations.

Referring back to FIG. 1, details of one specific exemplary configuration for calibrating the DPLL 100 are provided below as an example. In this specific example, two TDC measurements are made to measure a whole Fdco period (m0) and a half Fdco period (m1) by sharing the negative Fref clock edges between the two measurements to estimate the TDC resolution and offset parameters. The TDC measurement of the TDC module 110 is represented by the TDC output m, the Fdco period in time (e.g., second) is T, the underlying time associated to the m measurement is t. The TDC resolution is represented by "res" which is the time delay per one TDC delay element in FIG. 2. The follow equations for the TDC calibration can be obtained:

$$m0=(T-\text{offset})/res$$

$$m1=(T/2-\text{offset})/res$$

$$m0-m1=(T/2)/res$$

$$\text{offset}/res=(T/2)/res-m1$$

Based on the above, the following ratios can be expressed in measurements of m, m0 and m1:

$$T/res=2*(m0-m1)$$

$$t/res=m+m0-2*m1$$

$$\text{offset}/res=m0-2*m1$$

Based on the above calibration technique, measurements of a whole Fdco period (m0) and a half Fdco period (m1) can be used to determine both the TDC gain (A=T/res) and the TDC offset in terms of the TDC resolution.

Figure 4:
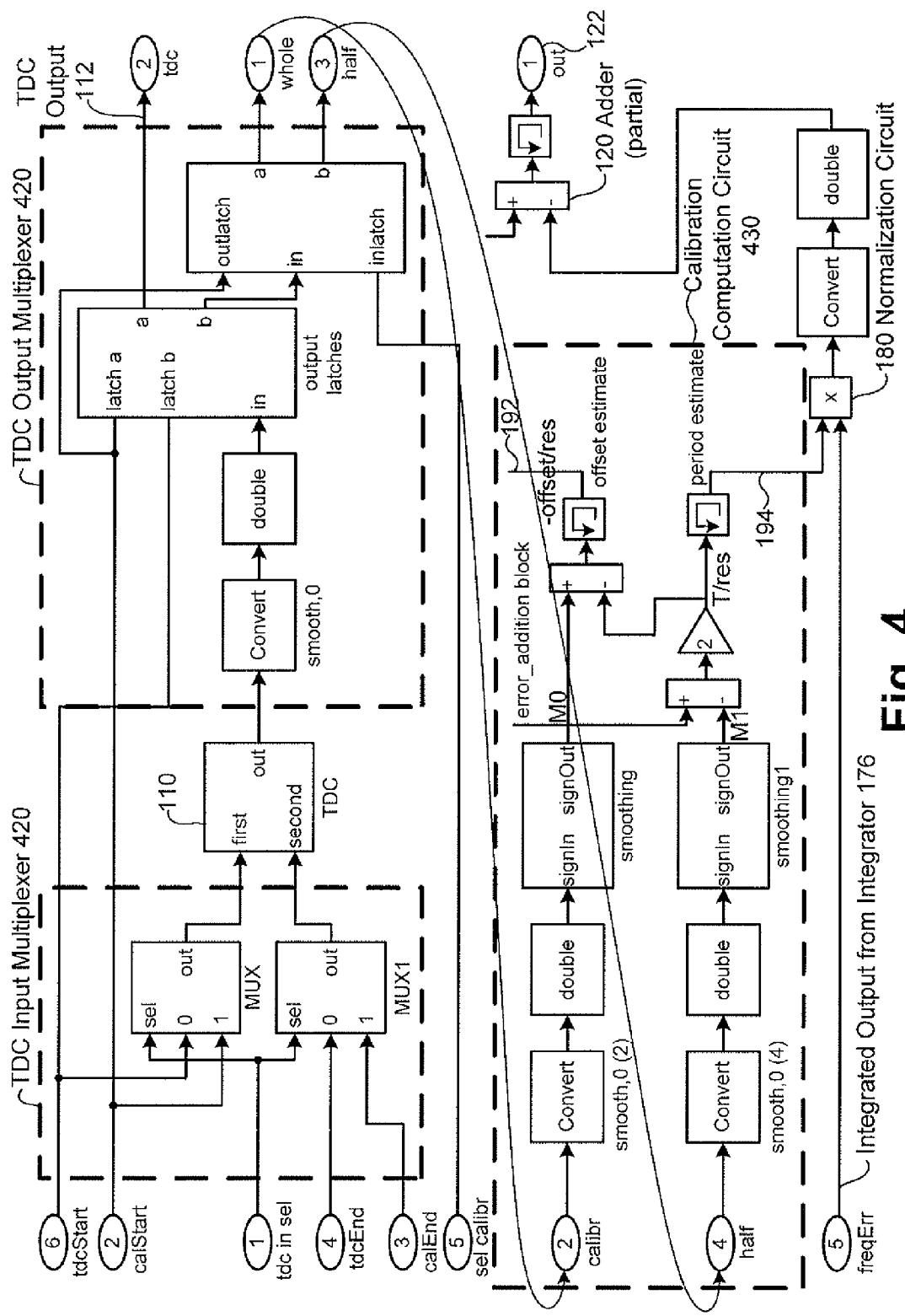
FIG. 4 shows an example of an implementation of a calibration circuit in FIG. 1.

FIG. 4 shows an example of one implementation of the calibration circuit 190 in FIG. 1 based on the above calibration technique. In this example, the calibration circuit 190 includes a TDC input multiplexer 410 for directing inputs to the TDC module 110 for both normal operation of the DPLL and the calibration of the TDC, a TDC output multiplexer 420 for directing the TDC output 112 and measurement outputs from the TDC module 110 for both normal operation of the DPLL and the calibration of the TDC and a calibration computation circuit 430 for computing the TDC gain (T/res) and the TDC offset (offset/res). Various related circuit elements in the DPLL 100 in FIG. 1 and the calibration circuit 190 are omitted in FIG. 4 for simplicity.

As illustrated in FIG. 4, the TDC input multiplexer 410 has a pair of calibration input ports 2 and 3 for inputs respectively labeled as "calStart" and "calEnd" that trigger and terminate the calibration of the calibration circuit 190, a pair of input ports 6 and 4 respectively labeled as "tdcStart" and "tdcEnd" for performing the TDC measurement based on the input reference signal 101 and the first feedback signal 102 into the TDC module 110 for normal TDC operation. The input port 1 labeled as "tdc in sel" is a control signal to select proper input pairs for the both normal operation of the DPLL and the calibration of the TDC. The TDC output multiplexer 420 receives four inputs: the inputs at input ports 6 and 2 of the TDC input multiplexer 410, the TDC output from the TDC module 110, and a control signal at the input port 5 labeled as "sel calbr" to control the calibration circuit 190 for performing the whole Fdco period measurement in one clock cycle and the half Fdco period measurement in the next clock cycle. The TDC output multiplexer 420 produces three outputs: TDC measurement 112 (m), the whole Fdco period measurement (m0) and the half Fdco period measurement (m1). The calibration computation circuit 430 receives the whole Fdco period measurement (m0) and the half Fdco period measurement (m1) from the TDC output multiplexer 420 to compute and generate the TDC gain (T/res) as the output signal 194 to the normalization circuit 180 and the TDC offset (offset/res) as the output signal 192 to the adder 120.

The above calibration technique and the associated calibration circuit design may also be implemented in the DPLL 300 in FIG. 3 where the conversion circuit 310 performs a division based on the TDC gain (T/res).

In the DPLL examples in FIGS. 1 and 3, the calibration circuit 190 provides a mechanism for determining the TDC gain to match the feedback signals from the two feedback loops at the adder 120 to produce a proper total phase error to the loop filter 130 and for determining the TDC offset. In the above description of the calibration circuit 190 in its operation with the two feedback loops, there are two clock domains present at several locations in the DPLL in FIGS. 1 and 3: a fast clock and a slow clock. For example, at the TDC module 110, the input reference clock signal 101 and the feedback clock signal 102 are in two different time domains where the feedback clock signal 102 has a clock rate clk $F_{ref}$ which is ($F_{dco}/\tilde{N}$). For another example, the counter 160 receives two inputs at two clock domains: the feedback clock signal 102 with a slow a clock rate clk $F_{ref}$ which is ($F_{dco}/\tilde{N}$) and the DCO output clock signal 142 with the fast clock $F_{dco}$. The presence of such two clock domains can cause significant increase in the time delays between the two feedback loops since the second feedback loop exhibits an additional delay. This can lead to undesired metastability in the DPLL and degrade the DPLL performance.

One method for mitigating such metastability in the DPLL is increasing the number of the TDC delay elements in the TDC module 110 to accommodate for the increased time delay between the input reference clock signal 101 and the feedback clock signal 102. This increase in the TDC delay elements in the TDC module 110 makes the TDC module 110 large in size and increases the power consumption of the TDC module 110. For system-on-chip applications where the DPLL is integrated with other circuits in a single chip and other applications, this increased size and power consumption in the TDC module 110 are undesirable.

One technique to avoid or to reduce the amount of the above increase in the TDC delay elements in the TDC module 110 is to use a supervisor circuit that monitors, at the sampling circuit 150, the relative timing of the rising edges of the input reference clock Fref (as the input data) and the fast clock Fdco and to effectuate a correction to the delay in the TDC output 112 within the adder 120. This correction at the adder 120 to the TDC output 112 can be used to offset the need to increase the number of TDC delay elements in the TDC module 110. With this mechanism, the TDC module 110 can be kept at a relatively small number of TDC delay elements and at a relatively low operating power.

Figure 5:
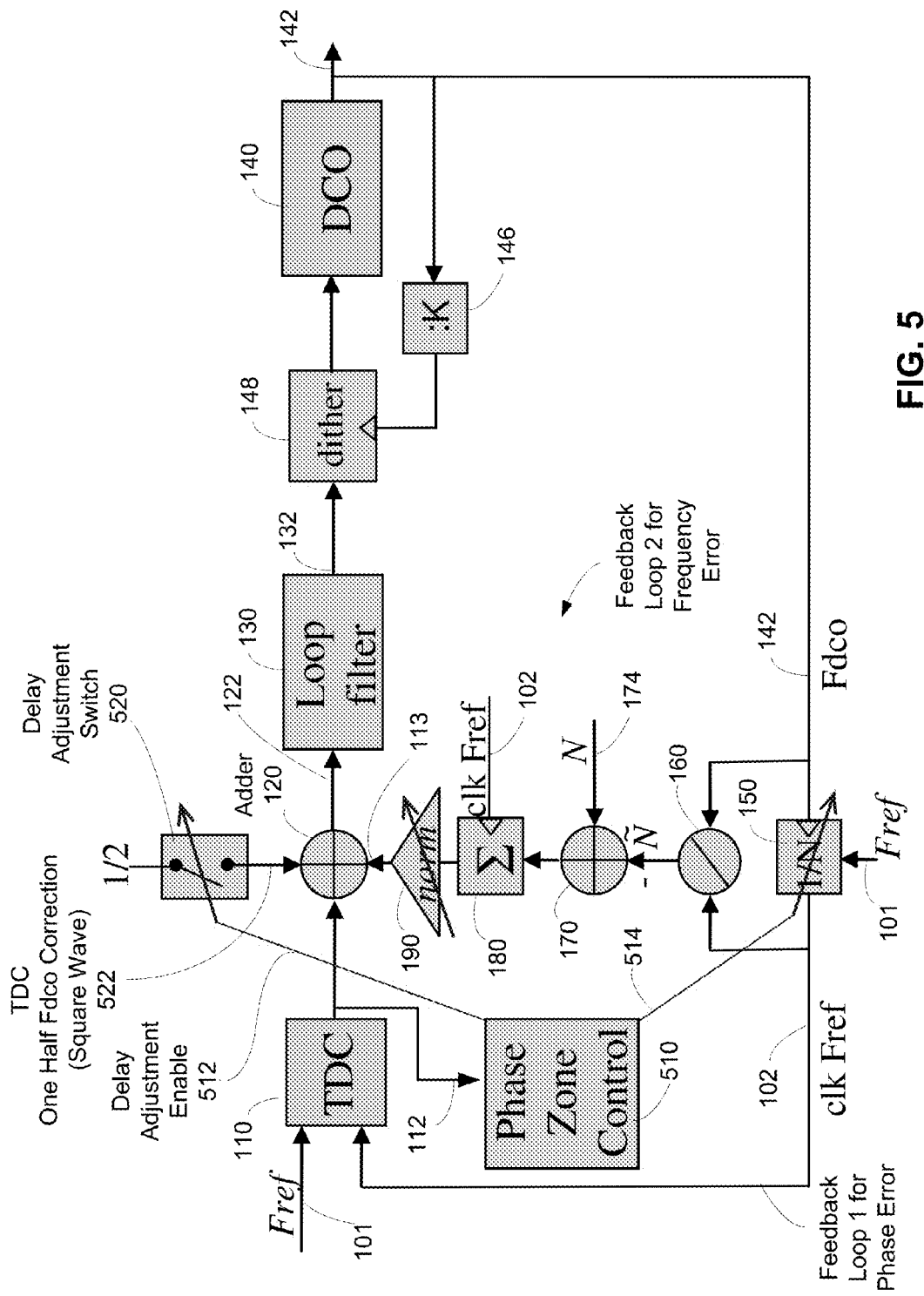
FIG. 5 shows an example of a digital phase locked loop (DPLL) circuit with two digital feedback loops and a supervisor circuit for controlling a correction to the TDC output.

FIG. 5 illustrates an example of a DPLL based on the designs in FIGS. 1 and 3 that implements such a correction to the TDC output 112 at the adder 120. A supervisor circuit 510 is provided to provide a phase zone control function that monitors the sampling circuit 150 in sampling the Fref at the Fdco clock to determine whether or not to enable the delay adjustment to the TDC output 112 at the adder 120. A delay adjustment switch 520 is coupled to the adder 120 to switch on or off the TDC delay adjustment under the control of the supervisor circuit 510 via a delay adjustment enable signal 512. The supervisor circuit 510 monitors timing between rising edges of the input reference clock signal 102 and the DCO output clock signal 142 and uses the monitored timing to adjust the timing of the sampling at the sampling circuit 150 via a sampling control signal or flag 514 and to cause a correction to a delay in time to the TDC output received at the adder 120 via an operation of the delay adjustment switch 520. More specifically, in this example, the supervisor circuit 510 uses the delay adjustment enable signal 512 to control the delay adjustment switch 520 to control adding or not adding one half period of the Fdco clock period to the TDC output 112 within the adder 120.

The TDC output 112 represents the phase error caused by the time elapsing between the rising edge of Fref and the first rising edge of Fdco that follows. The supervisor circuit 510 and the delay adjustment switch 520 collectively allow shifting a part of the TDC error to be measured by the TDC module 110 to the phase error in the integrated phase error in the second digital feedback signal 113 to the adder 120 provided the shifted part is quantized in half Fref periods. The frequency error can be controlled through the polarity of clocking Fref to produce the re-sampled Fref at the sampling circuit 150, i.e., controlling the sampling trigger of the sampling circuit 150 at either the rising edge or failing edge of the fast clock 142 Fdco. The corresponding change in the relative timing of the edges of the two inputs at the TDC module 110 is reflected to the TDC output value 122. The phase error needs to be compensated for this change in the TDC value by algebraically adding or subtracting the half Fdco period. This mechanism can control the clock polarity so that the TDC values stay away from 0 because there is an increased probability of metastability when the TDC output is close to 0 and they are forced to be within a desired range between 0 to 1 in the unit of one Fdco period, e.g., one quarter and three quarters of the Fdco period in some implementations.

Consider a situation with positive TDC values and negative frequency error values, the control flag can be asserted at the time instances where the TDC value resides outside the above specified range. This action is equivalent to adding half Fdco period at the TDC input and subtracting it from its output. If a step (s) represents the phase change per $F_{ref}$ clock cycle and the Half value (h) represents one half of Fdco period, a latency (l) represents the control loop latency in Fref cycles, and a current phase (v) represents the current TDC value after compensation and a prediction (p) represents the look ahead phase value, the following relationships can be established:

$$p=v+1*s$$

$$n=\text{floor}(p/2h)$$

$$r=p-n*2h$$

$$\text{flag}=(r<h/2 \text{ OR } r>3h/2)$$

Figure 6A:
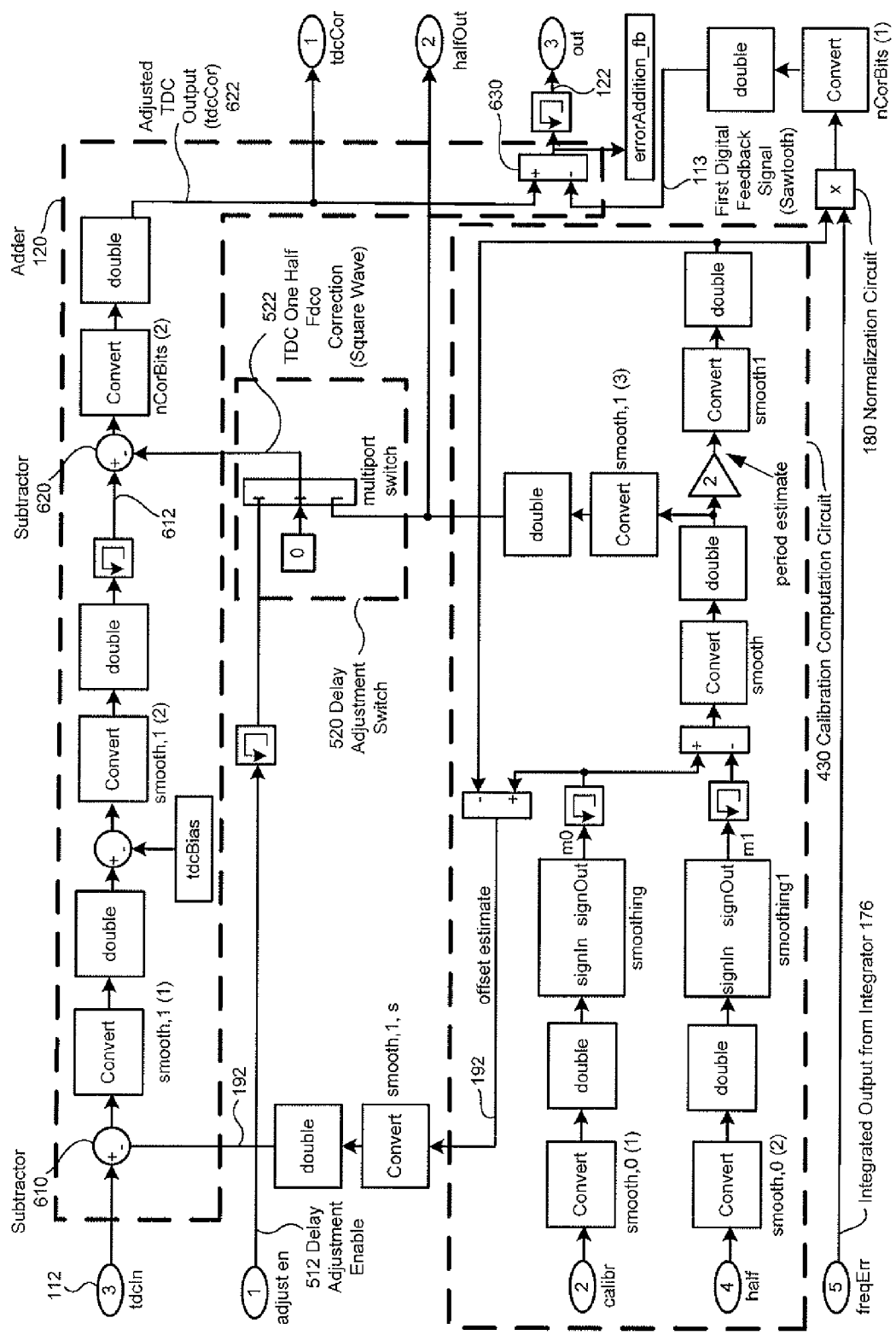
FIG. 6A shows an example of the various circuit elements for the DPLL in FIG. 5.
Figure 6B:
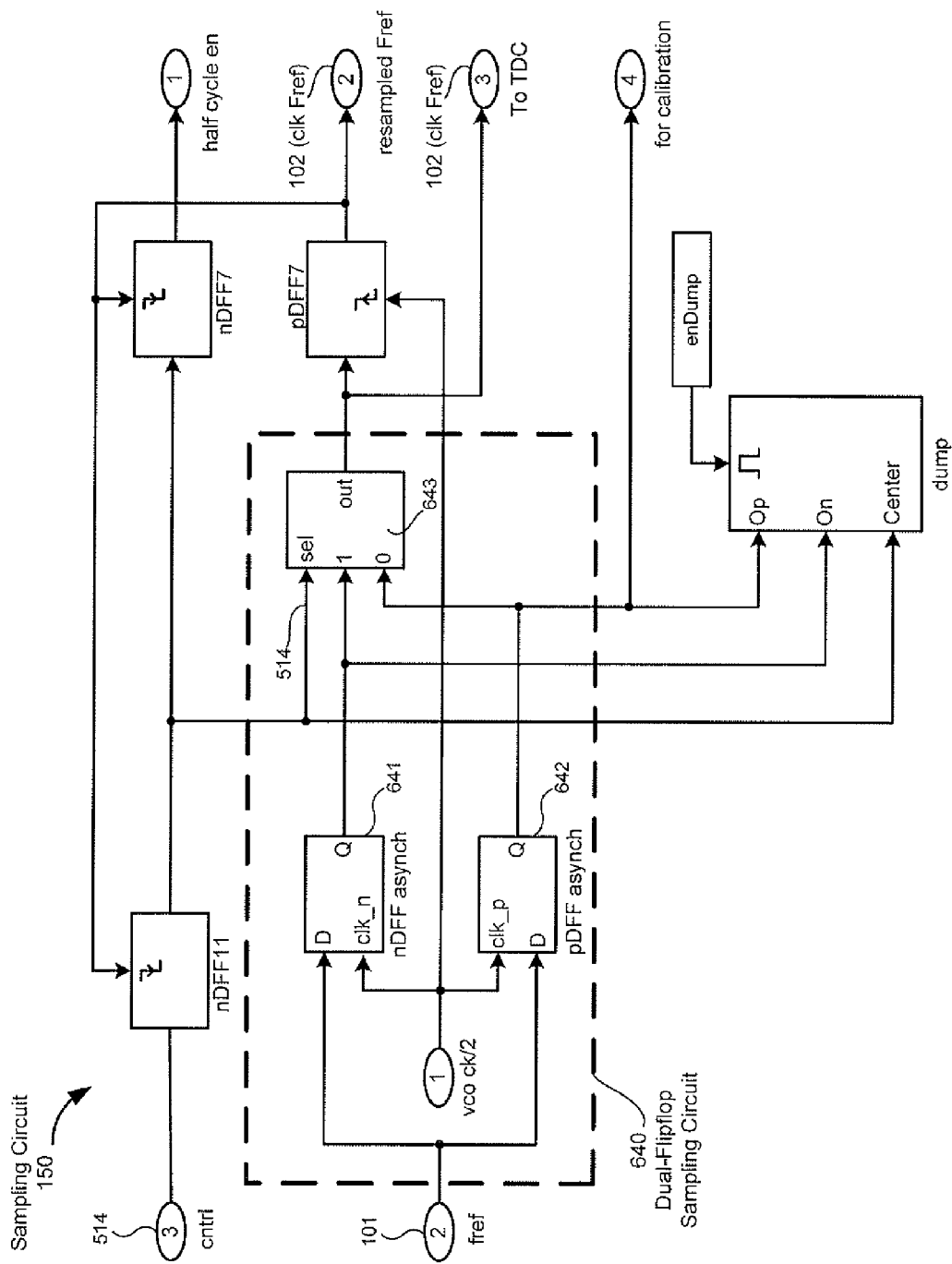
FIG. 6B shows an example of the sampling circuit designed for implementing a delay adjustment at the adder under the control of the supervisor circuit for the DPLL in FIG. 5.

FIGS. 6A and 6B show an example of the inner structure of the adder 120, the delay adjustment switch 520, the calibration computation circuit 430 of the calibration circuit 190 and the sampling circuit 150 designed for implementing the above delay adjustment at the adder 120 under the control of the supervisor circuit 510 for the DPLL in FIG. 5. The adder 120 includes a subtractor 610 that receives the TDC output 112 and subtracts TDC output 112 with the TDC offset in the signal 192 produced by the calibration circuit 190 to produce an output 612 that is directed to a second subtractor 620 inside the adder 120. Hence, the calibration circuit 190 is configured to cause a modification in form of an offset in the digital TDC output 112. The second subtractor 620 performs the TDC delay adjustment by adding the one half Fdco correction based on the whether the rising edge or falling edge of the DCO clock signal 142 is used for the sampling of the input reference clock signal 101 (Fref). The delay adjustment switch 520 in FIG. 5 is shown within the dotted box in FIGS. 6A and 6B and is operated under the control by the supervisor circuit 510 for the delay adjustment operation.

The supervisor circuit 510 in FIG. 5 produces the delay adjustment enable signal 512 to control the switch 520 that produces an output 522 labeled as TDC one half Fdco correction which has a value of 0 or one half Fdco period depending on the value of the delay adjustment enable signal 512. The output 612 of the subtractor 620 is the adjusted TDC output (tdcCor) 622 which is added with the integrated phase error in the first digital feedback signal 113 at an adder 630 within the adder 120 to produce the adder output 122 to the loop filter 130.

In the example illustrated in FIGS. 5, 6A and 6B, the supervisor circuit 510 is coupled to the sampling circuit 150 to monitor timing between rising edges of the input reference clock signal 101 and the DCO output clock signal 142 and uses the monitored timing to adjust a timing of the sampling at the sampling circuit 150 by using either the rising edge or the failing edge of the DCO output clock signal 142 to perform the sampling of the input reference clock signal 101. Assuming sampling by the rising edge of the DCO output clock signal 142 does not require a delay adjustment of the one half Fdco period at the adder 120, then the delay adjustment switch 520 is controlled not to add the one half Fdco period at the adder 120 when the rising edge or the failing edge of the DCO output clock signal 142 is used for sampling of the input reference clock signal 101. When the failing edge of the DCO output clock signal 142 is used to perform the sampling of the input reference clock signal 101, the supervisor circuit 510 controls the delay adjustment switch 520 to make a corresponding correction (i.e., one half Fdco in this example) to the delay in time to the TDC output received at the adder 120. In this context, the operation of the delay adjustment switch 520 and the sampling operation of the sampling circuit 150 are synchronized by the supervisor circuit 510.

Therefore, the supervisor circuit 510 in this specific example performs three tasks: (1) monitor timing between rising edges of the input reference clock signal 101 and the DCO output clock signal 142, (2) adjust a timing of the sampling at the sampling circuit 150 based on the monitored timing, and (3) control the delay adjustment switch 520 to cause a correction to a delay in time to the TDC output received at the adder 520.

The above monitoring function of the supervisor circuit 510 is illustrated in FIG. 5 can be achieved in various ways. In FIG. 5, the supervisor circuit 510 is coupled to receive the TDC output 112 as the monitoring feedback signal to the supervisor circuit 510 and the circuit 510 uses this information to monitor timing between rising edges of the input reference clock signal 101 and the DCO output clock signal 142. More specifically, the supervisor circuit 510 uses the current value of the TDC output 112 for the most recent sample produced by the sampling circuit 150 to predict the timing between rising edges of the input reference clock signal 101 and the DCO output clock signal 142 in the next sample to be sampled by the sampling circuit 150. Based on this prediction, the supervisor circuit 510 decides whether the rising edge or the failing edge of the DCO output clock signal 142 will be used in the next sampling operation at the sampling circuit 150. Accordingly, the supervisor circuit 510 sets the value of the delay adjustment enable signal 512 for controlling the delay adjustment switch 520.

Referring to FIG. 6B, an example of the sampling circuit 150 is provided for implementing the above delay adjustment at the adder 120 under the control of the supervisor circuit 510 for the DPLL in FIG. 5. This particular sampling circuit 150 includes a dual-flip-flop sampling circuit 640 to simultaneously use both the rising edge and the failing edge of the DCO output clock signal 142 to sample the input reference clock signal 101 to produce two sets of samples. More specifically, two flip-flop circuits 641 and 642 are provided to generate the two sets of samples, respectively. The flip-flop circuits 641 and 642 may be implemented by other sampling circuits different from flip-flop circuits. The first flip-flop circuit 641 samples the input reference clock signal 101 by using the rising edge of the DCO output clock signal 142 to produce the first set of samples and the second flip-flop circuit 642 samples the input reference clock signal 101 by using the failing edge of the DCO output clock signal 142 to produce the second set of samples. A switch or multiplexer 643 is coupled to both flip-flop circuits 641 and 642 to receive the first and second sets of the samples and is controlled by the control signal 514 from the supervisor circuit 510. Therefore, the output of the multiplexer 643 is the first digital feedback signal 102 and, due to the control by the supervisor circuit 510, the samples in the first digital feedback signal 102 a mixture of samples obtained by using both the rising edge and the failing edge of the DCO output clock signal 142.

In other implementations, the supervisor circuit 510 in FIG. 5 can be configured to control the sampling circuit 150 and the delay adjustment switch 520 without the feedback from the TDC output 112. The sampling 150 can monitor timing between rising edges of the input reference clock signal 101 and the DCO output clock signal 142 by a timing sensing circuit that is built in the sampling circuit 150 or is coupled to the sampling circuit 150. In one implementation, for example, this timing sensing circuit can include a third flip-flop circuit and a fourth flip-flop circuit that are coupled to the sampling circuits 641 and 642. The third flip-flop circuit is coupled to receive both the first and second sets of samples from the circuits 641 and 642 and uses the first set of samples as its clock signal to sample the second set of samples to produce a third output digital signal. The fourth flip-flop circuit is also coupled to receive both the first and second sets of samples from the circuits 641 and 642 and uses, different from the third flip-flop circuit, the second set of samples as its clock signal to sample the first set of samples to produce a fourth output digital signal. The supervisor circuit 510 uses the third and fourth output digital signals to select a sample from the first and second sets of samples as the next sample in the first digital feedback signal 102, and, based on this selection, decides whether or not to add the one half Fdco period at the adder 120.

Hence, in the above example, the delay adjustment made at the adder 120 is a selective operation depending on the property of the monitored timing between rising edges of the input reference clock signal 101 and the DCO output clock signal 142. The supervisor circuit uses the monitored timing to control the sampling of the sampling circuit 150 and to selectively cause a correction to a delay in time to the TDC output received at the adder 120.

Figure 7:
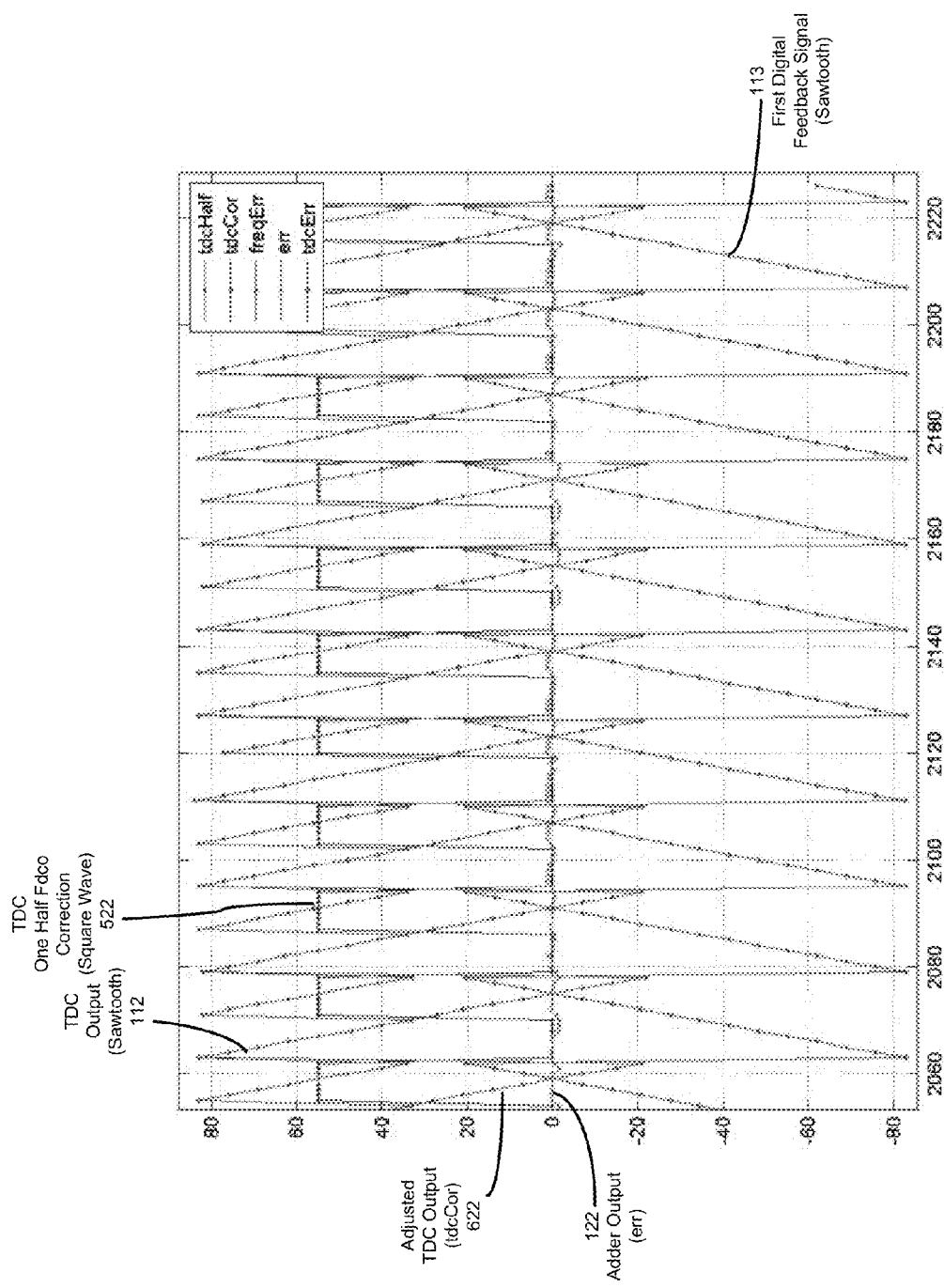
FIG. 7 shows an example of error signals in the DPLL in FIG. 6A.

FIG. 7 shows a timing chart of the signals 112, 522, 622, 113 and 122 in the DPLL circuit in FIG. 6A. The TDC output 112 is a sawtooth signal and the TDC one half Fdco correction signal 522 is a square wave signal. The subtraction between the signals 112 and 522 is the adjusted TDC output signal 622 which is nearly a mirror image of the phase error in the first digital feedback signal 113. Adding the signals 622 and 113 at the adder 630 produces the adder output 122 which is near zero under the normal operation of the DPLL.

A few embodiments have been described in detail above, and various modifications are possible. The disclosed subject matter, including the functional operations described in this document, can be implemented in electronic circuitry, computer hardware, firmware, software, or in combinations of them, such as the structural means disclosed in this document and structural equivalents thereof, including potentially a program operable to cause one or more data processing apparatus to perform the operations described (such as a program encoded in a computer-readable medium, which is a non-transitory medium which retains information recorded therein. Examples of such media include, e.g., a memory device, a storage device, a machine-readable storage substrate, or other physical, machine-readable medium, or a combination of one or more of them).

The term "data processing apparatus" encompasses all apparatus, devices, and machines for processing data, including by way of example a programmable processor, a computer, or multiple processors or computers. The apparatus can include, in addition to hardware, code that creates an execution environment for the computer program in question, e.g., code that constitutes processor firmware, a protocol stack, a database management system, an operating system, or a combination of one or more of them.

A program (also known as a computer program, software, software application, script, or code) can be written in any form of programming language, including compiled or interpreted languages, or declarative or procedural languages, and it can be deployed in any form, including as a stand alone program or as a module, component, subroutine, or other unit suitable for use in a computing environment. A program does not necessarily correspond to a file in a file system. A program can be stored in a portion of a file that holds other programs or data (e.g., one or more scripts stored in a markup language document), in a single file dedicated to the program in question, or in multiple coordinated files (e.g., files that store one or more modules, sub programs, or portions of code). A program can be deployed to be executed on one computer or on multiple computers that are located at one site or distributed across multiple sites and interconnected by a communication network.

While this document contains many specifics, these should not be construed as limitations on the scope of any invention or of what may be claimed, but rather as descriptions of features that may be specific to particular embodiments of particular inventions. Certain features that are described in this document in the context of separate embodiments can also be implemented in combination in a single embodiment. Conversely, various features that are described in the context of a single embodiment can also be implemented in multiple embodiments separately or in any suitable subcombination. Moreover, although features may be described above as acting in certain combinations and even initially claimed as such, one or more features from a claimed combination can in some cases be excised from the combination, and the claimed combination may be directed to a subcombination or variation of a subcombination.

Similarly, while operations are depicted in the drawings in a particular order, this should not be understood as requiring that such operations be performed in the particular order shown or in sequential order, or that all illustrated operations be performed, to achieve desirable results. In certain circumstances, multitasking and parallel processing may be advantageous. Moreover, the separation of various system components in the embodiments described above should not be understood as requiring such separation in all embodiments.

Only a few implementations and examples are described and other implementations, enhancements and variations can be made based on what is described and illustrated in this document.

What is claimed is:

1. A digital phase locked loop circuit comprising:
   a time-to-digital converter (TDC) configured to receive an input reference clock signal and a feedback clock signal and produce a first digital feedback signal;
   an adder configured to add said first digital feedback signal from a first feedback loop and a second digital feedback signal from a second feedback loop and produce a digital adder output;
   a digitally controlled oscillator (DCO) configured to receive said digital adder output and produce a DCO output clock signal, said DCO output clock signal being locked in phase to said input reference clock signal.

2. The digital phase locked loop circuit of claim 1, further comprising a calibration circuit coupled to at least one of said first and second feedback loops and configured to calibrate a TDC signal provided by said TDC.

3. The digital phase locked loop circuit of claim 1, further comprising a calibration circuit coupled to a conversion circuit to cause a first phase error from said first feedback loop and a second phase error from said second feedback to have a same unit.

4. The digital phase locked loop circuit of claim 3, wherein said conversion circuit includes a multiplication circuit and is coupled to said second feedback loop.

5. The digital phase locked loop circuit of claim 3, wherein said conversion circuit includes a division circuit and is coupled to said first feedback loop.

6. The digital phase locked loop circuit of claim 1, wherein said first and second feedback loops share a sampling circuit configured to sample said input reference clock signal at a clock rate of said DCO output clock signal.

7. The digital phase locked loop circuit of claim 6, further comprising a supervisor circuit configured to adjust a timing of a sampling at said sampling circuit.

8. The digital phase locked loop circuit of claim 1, wherein said second feedback loop includes a digital comparison circuit configured to produce a frequency error signal indicative of a frequency difference between a desired clock signal and said DCO output clock signal.

9. The digital phase locked loop circuit of claim 1, further comprising a digital integrator configured to convert a frequency difference between a desired frequency and a generated frequency of said DCO output clock signal into said second digital feedback signal.

10. The digital phase locked loop circuit of claim 1, further comprising a loop filter and a dither circuit coupled between said adder and said DCO.

* * * * *